(12) United States Patent
Rehder

(10) Patent No.: US 11,967,923 B2
(45) Date of Patent: Apr. 23, 2024

(54) SINGLE SHEET FOLDOUT SOLAR ARRAY

(71) Applicant: The Boeing Company, Chicago, IL (US)

(72) Inventor: Eric M. Rehder, Los Angeles, CA (US)

(73) Assignee: THE BOEING COMPANY, Arlington, VA (US)

( * ) Notice: Subject to any disclaimer, the term of this patent is extended or adjusted under 35 U.S.C. 154(b) by 0 days.

(21) Appl. No.: 15/938,787

(22) Filed: Mar. 28, 2018

(65) Prior Publication Data

US 2019/0305719 A1   Oct. 3, 2019

(51) Int. Cl.
*H02S 30/20*   (2014.01)
*H01L 27/142*   (2014.01)
*H01L 31/048*   (2014.01)
*H01L 31/05*   (2014.01)

(52) U.S. Cl.
CPC .......... *H02S 30/20* (2014.12); *H01L 27/142* (2013.01); *H01L 31/048* (2013.01); *H01L 31/05* (2013.01); *H01L 31/0508* (2013.01)

(58) Field of Classification Search
CPC ......... H02S 30/20; H02S 20/23; H01L 31/05; H01L 31/048
USPC .................................................. 136/244, 245
See application file for complete search history.

(56) References Cited

U.S. PATENT DOCUMENTS

| | | | |
|---|---|---|---|
| 3,376,164 A | 4/1968 | Bachwansky | |
| 3,833,426 A | 9/1974 | Mesch | |
| 4,057,439 A | 11/1977 | Lindmayer | |
| 4,257,821 A | 3/1981 | Kelly et al. | |
| 4,481,378 A | 11/1984 | Lesk | |
| 4,755,231 A | 7/1988 | Kurland et al. | |
| 5,330,583 A | 7/1994 | Asai et al. | |
| 5,567,248 A | 10/1996 | Chung | |
| 5,701,067 A * | 12/1997 | Kaji | A45C 15/00 136/293 |
| 5,855,692 A | 1/1999 | Kaji et al. | |
| 6,008,448 A | 12/1999 | Peck | |
| 6,034,322 A | 3/2000 | Pollard | |
| 6,156,967 A | 12/2000 | Ralph et al. | |
| 6,313,396 B1 * | 11/2001 | Glenn | H01L 31/042 136/244 |

(Continued)

FOREIGN PATENT DOCUMENTS

| | | |
|---|---|---|
| CN | 103155158 A | 6/2013 |
| CN | 203277428 U | 11/2013 |

(Continued)

OTHER PUBLICATIONS

English Machine Translation of CN 104443439A (Year: 2015).*

(Continued)

*Primary Examiner* — Kourtney R S Carlson
(74) *Attorney, Agent, or Firm* — GATES & COOPER LLP

(57) ABSTRACT

One or more solar cells are connected to a flex circuit, wherein: the flex circuit is single sheet; the flex circuit is comprised of a flexible substrate having one or more conducting layers for making electrical connections to the solar cells; and the flex circuit includes one or more flat sections where the solar cells are attached to the flex circuit that remain flat when the flex circuit is folded and one or more folding sections between the flat sections where the flex circuit is folded.

22 Claims, 13 Drawing Sheets

(56) References Cited

U.S. PATENT DOCUMENTS

| | | | |
|---|---|---|---|
| 6,350,944 | B1 | 2/2002 | Sherif et al. |
| 6,441,297 | B1 | 8/2002 | Keller et al. |
| 6,543,725 | B1* | 4/2003 | Meurer ............... B64G 1/443 |
| | | | 244/172.6 |
| 6,555,739 | B2 | 4/2003 | Kawam |
| 6,563,289 | B1 | 5/2003 | Cross |
| 6,637,702 | B1 | 10/2003 | McCandless |
| 8,814,099 | B1 | 8/2014 | Harvey et al. |
| 9,120,583 | B1 | 9/2015 | Spence et al. |
| 9,758,261 | B1 | 9/2017 | Steinfeldt |
| 2003/0057533 | A1 | 3/2003 | Lemmi et al. |
| 2004/0118446 | A1 | 6/2004 | Toyomura |
| 2005/0133079 | A1 | 6/2005 | Boulanger et al. |
| 2006/0170435 | A1 | 8/2006 | Granicher et al. |
| 2007/0005843 | A1 | 1/2007 | Sim et al. |
| 2007/0152194 | A1 | 7/2007 | Natekar et al. |
| 2008/0245405 | A1* | 10/2008 | Garvison ............... H01L 31/048 |
| | | | 136/251 |
| 2008/0295889 | A1 | 12/2008 | Schindler et al. |
| 2009/0183760 | A1 | 7/2009 | Meyer |
| 2009/0255571 | A1 | 10/2009 | Xia et al. |
| 2009/0272436 | A1 | 11/2009 | Cheung |
| 2009/0288702 | A1 | 11/2009 | Kim et al. |
| 2010/0012172 | A1 | 1/2010 | Meakin et al. |
| 2010/0089435 | A1 | 4/2010 | Lockenhoff |
| 2010/0126560 | A1 | 5/2010 | Lauvray et al. |
| 2010/0186795 | A1 | 7/2010 | Gaul |
| 2010/0212741 | A1 | 8/2010 | Lin |
| 2010/0295383 | A1 | 11/2010 | Cummings |
| 2010/0313954 | A1 | 12/2010 | Seel |
| 2011/0041890 | A1 | 2/2011 | Sheats |
| 2011/0073163 | A1 | 3/2011 | Cheung |
| 2011/0079263 | A1 | 4/2011 | Avrutsky |
| 2011/0168238 | A1 | 7/2011 | Metin et al. |
| 2011/0198444 | A1 | 8/2011 | Dong |
| 2012/0103388 | A1 | 5/2012 | Meakin et al. |
| 2012/0125391 | A1 | 5/2012 | Pinarbasi et al. |
| 2012/0161801 | A1 | 6/2012 | Hasegawa |
| 2012/0199176 | A1 | 8/2012 | Hong et al. |
| 2012/0313455 | A1 | 12/2012 | Latham |
| 2013/0014802 | A1 | 1/2013 | Zimmerman |
| 2013/0056047 | A1 | 3/2013 | Beck et al. |
| 2013/0263915 | A1 | 10/2013 | Snidow |
| 2014/0000682 | A1 | 1/2014 | Zhao et al. |
| 2014/0033625 | A1 | 2/2014 | Jenkins et al. |
| 2014/0083497 | A1 | 3/2014 | Ehrenpfordt et al. |
| 2014/0166067 | A1 | 6/2014 | McGlynn et al. |
| 2014/0255780 | A1 | 9/2014 | Mikhaylik et al. |
| 2014/0366927 | A1 | 12/2014 | Lavrova et al. |
| 2015/0083191 | A1* | 3/2015 | Gmundner ............... H02S 30/20 |
| | | | 136/245 |
| 2015/0096607 | A1 | 4/2015 | Yong |
| 2015/0287862 | A1 | 10/2015 | Pardell Vilella |
| 2015/0318420 | A1 | 11/2015 | Sewell et al. |
| 2015/0349703 | A1 | 12/2015 | Morad et al. |
| 2016/0112004 | A1 | 4/2016 | Thiel et al. |
| 2016/0126380 | A1* | 5/2016 | Chang ............... H01L 31/048 |
| | | | 136/251 |
| 2016/0197207 | A1 | 7/2016 | Morioka et al. |
| 2016/0218665 | A1 | 7/2016 | Crist |
| 2016/0380221 | A1 | 12/2016 | Gotanda et al. |
| 2017/0018670 | A1 | 1/2017 | Bende et al. |
| 2017/0040933 | A1 | 2/2017 | Vogel |
| 2017/0054406 | A1 | 2/2017 | Narla et al. |
| 2017/0098736 | A1 | 4/2017 | Lee et al. |
| 2017/0229692 | A1 | 8/2017 | Thiel et al. |
| 2017/0374737 | A1 | 12/2017 | Jeong et al. |
| 2018/0097472 | A1* | 4/2018 | Anderson ............... H02S 40/36 |
| 2019/0127089 | A1* | 5/2019 | Tomoda ............... H01L 31/0443 |
| 2019/0131464 | A1* | 5/2019 | Seki ............... H02S 40/36 |
| 2019/0140584 | A1* | 5/2019 | Hayashi ............... H02S 40/36 |

FOREIGN PATENT DOCUMENTS

| | | | |
|---|---|---|---|
| CN | 104241406 A | | 12/2014 |
| CN | 104443439 | | 3/2015 |
| CN | 104443439 A | * | 3/2015 |
| CN | 104443439 A | | 3/2015 |
| CN | 206505935 | | 9/2017 |
| DE | 1013644 | | 2/2003 |
| DE | 10136442 | | 2/2003 |
| DE | 10136442 A1 | | 2/2003 |
| EP | 1160876 | | 12/2001 |
| EP | 1548847 | | 6/2005 |
| EP | 3297042 | | 3/2018 |
| JP | H07223597 A | | 8/1995 |
| JP | 2002190612 | | 7/2002 |
| JP | 2002190612 A | | 7/2002 |
| JP | 2008533720 A | | 8/2008 |
| JP | 2011071214 | | 4/2011 |
| WO | 2017195289 | | 11/2017 |

OTHER PUBLICATIONS

Non-Final Office Action dated Jan. 7, 2021 for U.S. Appl. No. 15/787,291.
Non-Final Office Action dated Jan. 8, 2020 for U.S. Appl. No. 15/787,304.
Final Office Action dated Jan. 15, 2019 for Utility U.S. Appl. No. 15/643,277.
Non-Final Office Action dated Jan. 17, 2020 for U.S. Appl. No. 15/643,285.
Final Office Action dated Jan. 20, 2022 for U.S. Appl. No. 15/643,285.
Non-Final Office Action dated Jan. 28, 2019 for U.S. Appl. No. 15/643,289.
Non-Final Office Action dated Feb. 1, 2021 for U.S. Appl. No. 15/643,277.
Non-Final Office Action dated Feb. 4, 2020 for U.S. Appl. No. 15/787,291.
Non-Final Office Action dated Feb. 5, 2019 for Utility U.S. Appl. No. 15/543,282.
Final Office Action dated Feb. 6, 2023 for U.S. Appl. No. 17/100,823.
Final Office Action dated Feb. 6, 2020 for U.S. Appl. No. 15/643,287.
Final Office Action dated Feb. 6, 2020 for U.S. Appl. No. 15/643,279.
Non-Final Office Action dated Feb. 8, 2019 for Utility U.S. Appl. No. 15/643,274.
Final Office Action dated Feb. 11, 2022 for U.S. Appl. No. 16/847,032.
Final Office Action dated Feb. 14, 2022 for U.S. Appl. No. 16/847,359.
Non-Final Office Action dated Feb. 18, 2021 for U.S. Appl. No. 15/938,791.
European Communication dated Feb. 19, 2020 for EP Application No. 18176224.6.
Non-Final Office Action dated Feb. 21, 2019 for U.S. Appl. No. 15/643,285.
Final Office Action dated Feb. 24, 2022 for U.S. Appl. No. 15/643,277.
Final Office Action dated Mar. 5, 2021 for U.S. Appl. No. 15/643,279.
Final Office Action dated Mar. 12, 2021 for U.S. Appl. No. 15/643,282.
Non-Final Office Action dated Mar. 14, 2019 for U.S. Appl. No. 15/787,304.
Non-Final Office Action dated Mar. 14, 2019 for U.S. Appl. No. 15/787,291.
Non-Final Office Action dated Mar. 14, 2022 for U.S. Appl. No. 15/643,282.
Non-Final Office Action dated Mar. 19, 2020 for U.S. Appl. No. 15/643,289.
Non-Final Office Action dated Mar. 24, 2020 for U.S. Appl. No. 15/643,277.
Non-Final Office Action dated Mar. 31, 2020 for U.S. Appl. No. 15/643,274.
Final Office Action dated Mar. 31, 2023 for U.S. Appl. No. 15/643,279.
Final Office Action dated Apr. 10, 2019 for U.S. Appl. No. 15/643,279.
Final Office Action dated Apr. 10, 2020 for U.S. Appl. No. 15/643,282.
Final Office Action dated Apr. 15, 2020 for U.S. Appl. No. 15/938,791.

(56) References Cited

OTHER PUBLICATIONS

Final Office Action dated Apr. 18, 2023 for U.S. Appl. No. 16/991,589.
Non-Final Office Action dated Apr. 19, 2023 for U.S. Appl. No. 15/787,304.
Notice of Allowance dated Apr. 20, 2022 for U.S. Appl. No. 15/643,289.
Final Office Action dated Apr. 22, 2021 for U.S. Appl. No. 15/643,285.
Notice of Allowance dated Apr. 23, 2020 for U.S. Appl. No. 15/643,287.
Non-Final Office Action dated Apr. 23, 2018 for U.S. Appl. No. 15/623,489.
Non-Final Office Action dated May 5, 2023 for U.S. Appl. No. 15/797,291.
Non-Final Office Action dated May 11, 2023 for U.S. Appl. No. 15/643,277.
Non-Final Office Action dated May 12, 2021 for U.S. Appl. No. 15/643,274.
Final Office Action dated May 19, 2020 for U.S. Appl. No. 15/787,304.
Final Office Action dated Jun. 1, 2021 for U.S. Appl. No. 15/643,277.
Final Office Action dated Jun. 3, 2022 for U.S. Appl. No. 15/643,279.
Final Office Action dated Jun. 6, 2019 for U.S. Appl. No. 15/643,282.
Final Office Action dated Jun. 8, 2020 for U.S. Appl. No. 15/643,285.
Final Office Action dated Jun. 15, 2020 for U.S. Appl. No. 15/787,291.
Final Office Action dated Jun. 15, 2023 for U.S. Appl. No. 15/643,285.
Notice of Allowance dated Jun. 23, 2022 for U.S. Appl. No. 16/847,359.
Final Office Action dated Jun. 27, 2023 for U.S. Appl. No. 15/643,282.
Non-Final Office Action dated Jul. 1, 2022 for U.S. Appl. No. 15/643,277.
Final office Action dated Jul. 7, 2023 for U.S. Appl. No. 17/878,348.
Extended European Search Report dated Jul. 8, 2019 for European Patent Application No. 19162438.6.
Final Office Action dated Jul. 9, 2019 for U.S. Appl. No. 15/787,304.
Final Office Action dated Jul. 12, 2019 for U.S. Appl. No. 15/643,285.
Final Office Action dated Jul. 17, 2019 for U.S. Appl. No. 15/6787,291.
Non-Final Office Action dated Jul. 23, 2019 for U.S. Appl. No. 15/643,279.
Non-Final Office Action dated Jul. 28, 2020 for U.S. Appl. No. 15/643,279.
Final Office Action dated Jul. 28, 2020 for U.S. Appl. No. 15/643,277.
Non-Final Office Action dated Jul. 30, 2018 for U.S. Appl. No. 15/643,277.
Non-Final Office Action dated Aug. 2, 2021 for U.S. Appl. No. 15/643,282.
Non-Final Office Action dated Aug. 4, 2023 for U.S. Appl. No. 17/100,823.
Final Office Action dated Aug. 6, 2019 for U.S. Appl. No. 15/643,289.
Final Office Action dated Aug. 13, 2021 for U.S. Appl. No. 15/938,791.
Non-Final Office Action dated Aug. 18, 2021 for U.S. Appl. No. 15/643,285.
Non-Final Office Action dated Aug. 18, 2021 for U.S. Appl. No. 15/787,291.
Non-Final Office Action dated Aug. 18, 2021 for U.S. Appl. No. 15/787,304.
European Examination Report dated Aug. 19, 2020 for European Patent Application No. 19162438.6.
Final Office Action dated Aug. 22, 2019 for U.S. Appl. No. 15/643,274.
Final Office Action dated Aug. 25, 2022 for U.S. Appl. No. 15/643,282.
Final Office Action dated Aug. 28, 2018 for U.S. Appl. No. 15/643,289.
Final Office Action dated Sep. 2, 2020 for U.S. Appl. No. 15/643,274.
Non-Final Office Action dated Sep. 15, 2022 for U.S. Appl. No. 16/543,279.
Non-Final Office Action dated Sep. 17, 2021 for U.S. Appl. No. 15/643,277.
Non-Final Office Action dated Sep. 21, 2022 for U.S. Appl. No. 17/100,823.
Non-Final Office Action dated Sep. 23, 2022 for U.S. Appl. No. 16/991,589.
Non-Final Office Action dated Sep. 27, 2019 for U.S. Appl. No. 15/643,287.
Non-Final Office Action dated Sep. 29, 2021 for U.S. Appl. No. 15/643,289.
Final Office Action dated Oct. 1, 2020 for U.S. Appl. No. 15/643,289.
Non-Final Office Action dated Oct. 5, 2018 for U.S. Appl. No. 15/643,279.
Final Office Action dated Oct. 10, 2019 for U.S. Appl. No. 15/643,277.
Extended European Search Report dated Nov. 8, 2018 for EP Application No. 18176224.6.
Non-Final Office Action dated Nov. 9, 2020 for U.S. Appl. No. 15/643,282.
Extended European Search Report dated Nov. 12, 2018 for EP Application No. 18176222.0.
Non-Final Office Action dated Nov. 14, 2022 for U.S. Appl. No. 15/643,285.
Non-Final Office Action dated Nov. 22, 2019 for U.S. Appl. No. 15/938,791.
European Examination Communication dated Dec. 1, 2020 for EP Application No. 17191162.1.
Final Office Action dated Dec. 1, 2022 for U.S. Appl. No. 15/643,277.
Non-Final Office Action dated Dec. 6, 2021 for U.S. Appl. No. 15/643,279.
Non-Final Office Action dated Dec. 7, 2020 for U.S. Appl. No. 15/787,304.
Non-Final Office Action dated Dec. 9, 2019 for U.S. Appl. No. 15/643,282.
Final Office Action dated Dec. 15, 2021 for U.S. Appl. No. 15/787,304.
Final Office Action dated Dec. 17, 2021 for U.S. Appl. No. 15/787,291.
Non-Final Office Action dated Dec. 20, 2022 for U.S. Appl. No. 15/643,282.
Non-Final Office Action dated Dec. 22, 2020 for U.S. Appl. No. 15/643,285.
Non-Final Office Action dated Dec. 23, 2022 for U.S. Appl. No. 17/878,348.
Final Office Action dated Dec. 28, 2021 for U.S. Appl. No. 15/643,282.
Japanese Notice of Reasons for Rejection dated Aug. 22, 2023 for Japanese Patent Application No. 2019-050639.
Japanese Notice of Reasons for Rejection dated Mar. 7, 2023 for JP Application No. 2019-050639.
Stern et al. "Modular solar panels using components engineered for producibility," 2011 37th IEEE Photovoltaic Specialists Conference, Seattle, WA, 2011, p. 001626-001629.
http://www.fralock.com/aerospace/industrial-manufacturing-company/flexible-solar-array-back-panels-grounding- straps/.
https://news.lockheedmartin.com/news-releases?item=128302#assets_20295_128302-117.
Final Office Action dated Sep. 11, 2023 for U.S. Appl. No. 15/787,291.
Non-Final Office Action dated Sep. 25, 2023 for U.S. Appl. No. 16/847,032.
Non-Final Office Action dated Sep. 20, 2023 for U.S. Appl. No. 16/991,589.
Non-Final Office Action dated Sep. 13, 2023 for U.S. Appl. No. 15/643,279.
Final Office Action dated Oct. 10, 2023 for U.S. Appl. No. 15/938,791.
Non-Final Office Action dated Dec. 27, 2023 for U.S. Appl. No. 15/787,291.
Final Office Action dated Jan. 9, 2024 for U.S. Appl. No. 17/100,823.
Notice of Allowance dated Jan. 24, 2024 for U.S. Appl. No. 16/847,032.
Non-Final Office Action dated Feb. 8, 2024 for U.S. Appl. No. 15/938,791.
Non-Final Office Action dated Jan. 26, 2024 for U.S. Appl. No. 15/787,304.
Final Office Action dated Nov. 15, 2023 for U.S. Appl. No. 15/643,277.
Non-Final Office Action dated Oct. 25, 2023 for U.S. Appl. No. 15/643,274.

(56) References Cited

OTHER PUBLICATIONS

Non-Final Office Action dated Oct. 26, 2023 for U.S. Appl. No. 17/878,348.
1 Non-Final Office Action dated Nov. 9, 2023 for U.S. Appl. No. 15/643,282.

* cited by examiner

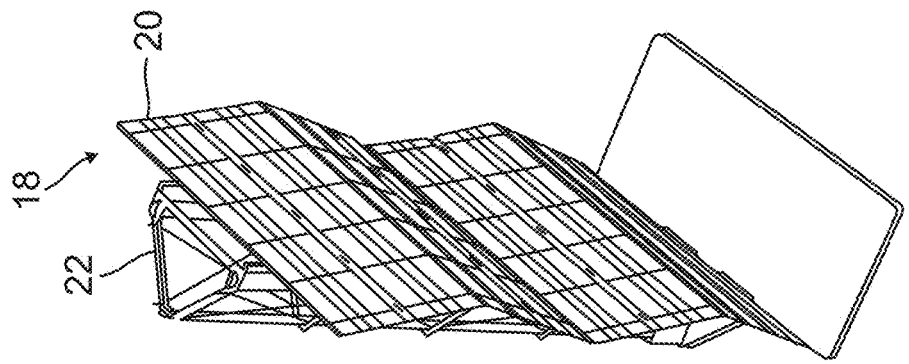
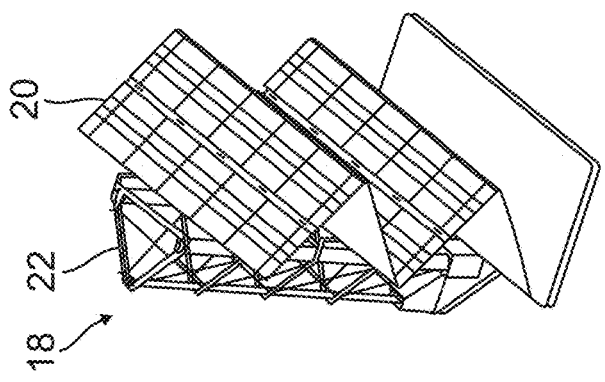
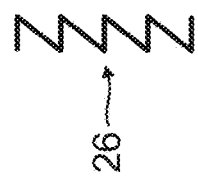
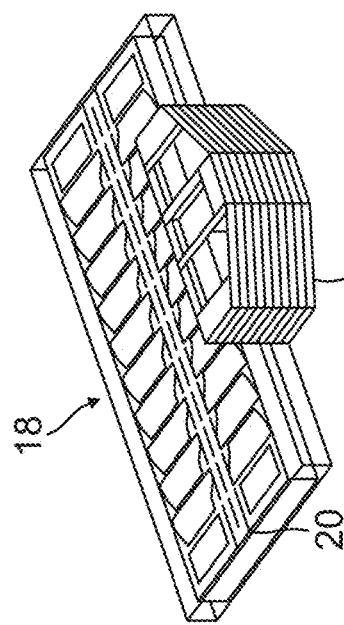
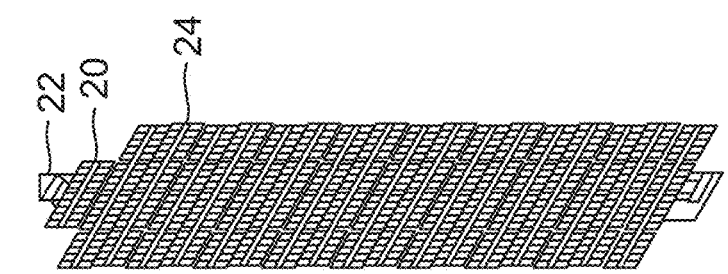

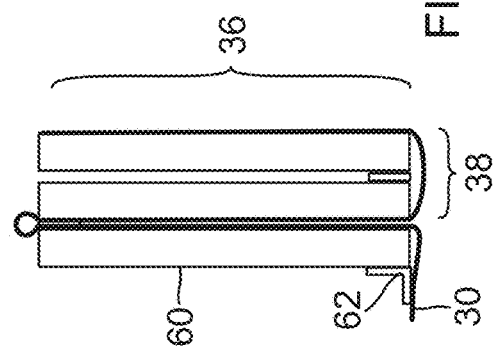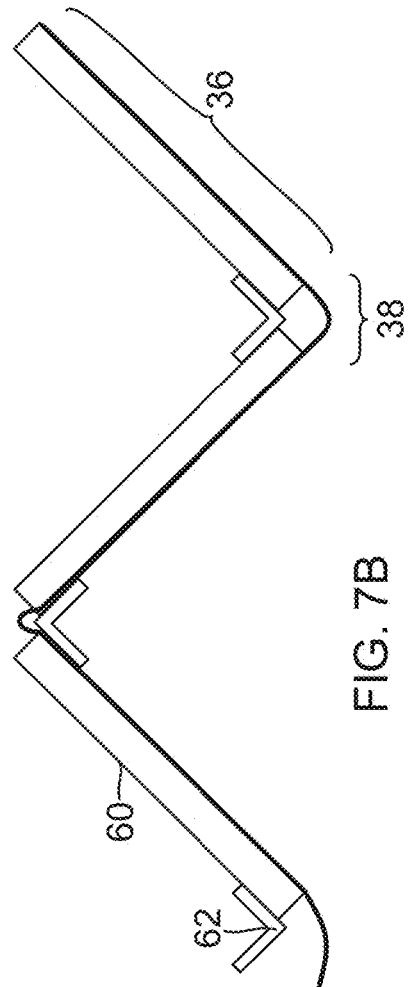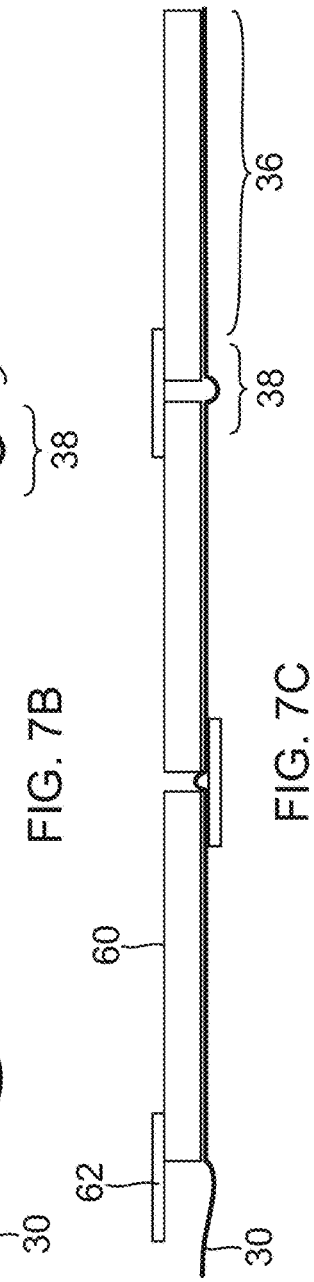

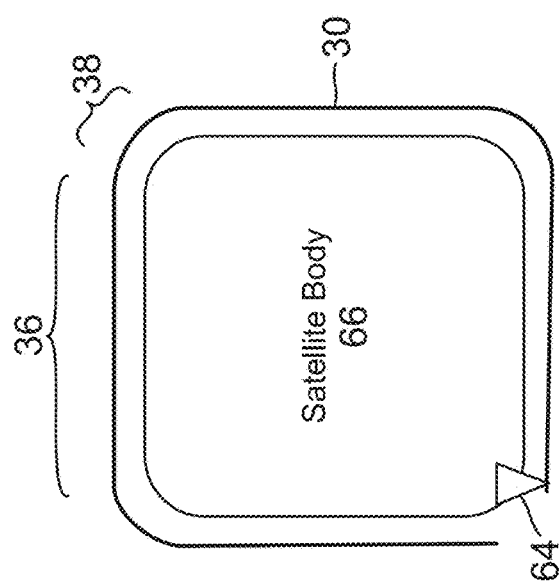
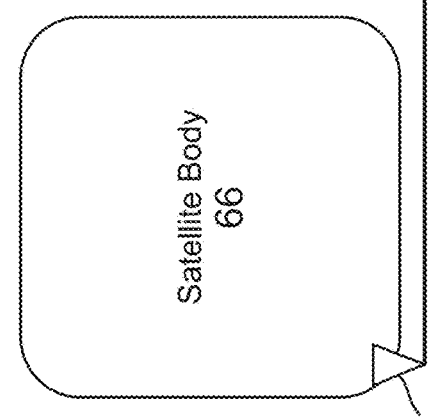

SINGLE SHEET FOLDOUT SOLAR ARRAY

CROSS REFERENCE TO RELATED APPLICATIONS

This application is related to the following co-pending and commonly-assigned applications:

U.S. Utility application Ser. No. 15/643,274, filed on Jul. 6, 2017, by Eric Rehder, entitled "SOLAR CELL ARRAY CONNECTIONS USING CORNER CONDUCTORS,";

U.S. Utility application Ser. No. 15/643,277, filed on Jul. 6, 2017, by Eric Rehder, entitled "PREFABRICATED CONDUCTORS ON A SUBSTRATE TO FACILITATE CORNER CONNECTIONS FOR A SOLAR CELL ARRAY,";

U.S. Utility application Ser. No. 15/643,279, filed on Jul. 6, 2017, by Eric Rehder, entitled "REWORK AND REPAIR OF COMPONENTS IN A SOLAR ARRAY,";

U.S. Utility application Ser. No. 15/643,282, filed on Jul. 6, 2017, by Eric Rehder, entitled "POWER ROUTING MODULE FOR A SOLAR ARRAY,";

U.S. Utility application Ser. No. 15/643,285, filed on Jul. 6, 2017, by Eric Rehder, entitled "POWER ROUTING MODULE WITH A SWITCHING MATRIX FOR A SOLAR CELL ARRAY,";

U.S. Utility application Ser. No. 15/643,287, filed on Jul. 6, 2017, by Eric Rehder, entitled "NANO-METAL CONNECTIONS FOR A SOLAR CELL ARRAY,"; and U.S. Utility application Ser. No. 15/643,289, filed on Jul. 6, 2017, by Eric Rehder, Philip Chiu, Tom Crocker, Daniel Law and Dale Waterman, entitled "SOLAR CELLS FOR A SOLAR CELL ARRAY,";

all of which applications claim the benefit under 35 U.S.C. Section 119(e) of the following commonly-assigned provisional applications:

U.S. Provisional Application Ser. No. 62/394,636, filed on Sep. 14, 2016, by Eric Rehder, entitled "SOLAR CELL ARRAY CONNECTIONS,";

U.S. Provisional Application Ser. No. 62/394,616, filed on Sep. 14, 2016, by Eric Rehder, entitled "CORNER CONNECTORS FOR A SOLAR CELL ARRAY,";

U.S. Provisional Application Ser. No. 62/394,623, filed on Sep. 14, 2016, by Eric Rehder, entitled "PREFABRICATED CONDUCTORS ON A SUBSTRATE TO FACILITATE CORNER CONNECTIONS FOR A SOLAR CELL ARRAY,";

U.S. Provisional Application Ser. No. 62/394,627, filed on Sep. 14, 2016, by Eric Rehder, entitled "SELECT CURRENT PATHWAYS IN A SOLAR CELL ARRAY,";

U.S. Provisional Application Ser. No. 62/394,629, filed on Sep. 14, 2016, by Eric Rehder, entitled "MULTILAYER CONDUCTORS IN A SOLAR CELL ARRAY,";

U.S. Provisional Application Ser. No. 62/394,632, filed on Sep. 14, 2016, by Eric Rehder, entitled "REWORK AND REPAIR OF COMPONENTS IN A SOLAR CELL ARRAY,";

U.S. Provisional Application Ser. No. 62/394,649, filed on Sep. 14, 2016, by Eric Rehder, entitled "POWER ROUTING MODULE FOR A SOLAR CELL ARRAY,";

U.S. Provisional Application Ser. No. 62/394,666, filed on Sep. 14, 2016, by Eric Rehder, entitled "POWER ROUTING MODULE WITH A SWITCHING MATRIX FOR A SOLAR CELL ARRAY,";

U.S. Provisional Application Ser. No. 62/394,667, filed on Sep. 14, 2016, by Eric Rehder, entitled "NANO-METAL CONNECTIONS FOR A SOLAR CELL ARRAY,";

U.S. Provisional Application Ser. No. 62/394,671, filed on Sep. 14, 2016, by Eric Rehder, entitled "BACK CONTACTS FOR A SOLAR CELL ARRAY,";

U.S. Provisional Application Ser. No. 62/394,641, filed on Sep. 14, 2016, by Eric Rehder, entitled "PRINTED CONDUCTORS IN A SOLAR CELL ARRAY,"; and U.S. Provisional Application Ser. No. 62/394,672, filed on Sep. 14, 2016, by Eric Rehder, Philip Chiu, Tom Crocker and Daniel Law, entitled "SOLAR CELLS FOR A SOLAR CELL ARRAY,";

all of which applications are incorporated by reference herein.

This application also is related to the following co-pending and commonly-assigned applications:

U.S. Utility application Ser. No. 15/787,291, filed on Oct. 18, 2017, by Eric Rehder, entitled "SOLAR CELL ARRAY WITH CHANGEABLE STRING LENGTH,"; and U.S. Utility application Ser. No. 15/787,304, filed on Oct. 18, 2017, by Eric Rehder, entitled "SOLAR CELL ARRAY WITH BYPASSED SOLAR CELLS,";

both of which applications claim the benefit under 35 U.S.C. Section 119(e) of commonly-assigned provisional applications:

U.S. Provisional Application Ser. No. 62/518,125, filed on Jun. 12, 2017, by Eric Rehder, entitled "SOLAR CELL ARRAY WITH CHANGEABLE STRING LENGTH,"; and U.S. Provisional Application Ser. No. 62/518,131, filed on Jun. 12, 2017, by Eric Rehder, entitled "SOLAR CELL ARRAY WITH BYPASSED SOLAR CELLS,";

all of which applications are incorporated by reference herein.

In addition, this application is related to the following co-pending and commonly-assigned application:

U.S. Utility application Ser. No. 15/938,791, filed on same date herewith Mar. 28, 2018, by Eric Rehder, entitled "WIRING FOR A RIGID PANEL SOLAR ARRAY,";

which application is incorporated by reference herein.

BACKGROUND INFORMATION

1. Field

The disclosure is related generally to solar cell panels and more specifically to a single sheet foldout solar array.

2. Background

A spacecraft solar array is often folded so that the solar array is a compact size during storage for launch. The solar array will later fold out into a larger configuration during deployment in order to increase its surface area for power generation.

A solar array generally is comprised of multiple panels connected together by mechanical hinges, wherein each panel is populated with multiple solar cells to produce electric power. Wiring must be completed across the panels to carry power to the spacecraft.

Existing solutions have a number of drawbacks, including extensive labor in the design, manufacturing, and testing of the wiring. Moreover, the wiring must be able to withstand the storage and deployment that involves folding and unfolding the solar array. Smaller satellites and larger solar arrays make these issues worse.

What is needed, then, is a means for simplifying the design, manufacturing, and testing of solar arrays that are folded and unfolded.

SUMMARY

To overcome the limitations described above, and to overcome other limitations that will become apparent upon reading and understanding the present specification, the present disclosure describes one or more solar cells connected to a flex circuit, wherein: the flex circuit is a single sheet; the flex circuit is comprised of a flexible substrate having one or more conducting layers for making electrical connections to the solar cells; and the flex circuit includes one or more flat sections where the solar cells are attached to the flex circuit that remain flat when the flex circuit is folded and one or more folding sections between the flat sections where the flex circuit is folded.

The flex circuit can include one or more insulating layers for insulating the conducting layers. The conducting layers can be embedded in the flex circuit or deposited on the flex circuit. Both the flat sections and the folding sections can include the conducting layers. The conducting layers connect the solar cells in the flat sections, as well as the solar cells between the flat sections and across the folding sections. Moreover, the conducting layers carry current off the flex circuit.

The flex circuit can be folded in a Z-fold configuration. Moreover, the flex circuit can include wings that extend perpendicular to folds in the flex circuit.

The flex circuit can be so dimensioned as to connect to one or more panels of the solar cells. Alternatively, the flex circuit can be so dimensioned as to connect to a portion of one or more panels of the solar cells. In addition, there can be a plurality of the flex circuits extending across one of the folding sections.

The solar cells are mechanically attached to the flex circuit. The flex circuit and solar cells also are mechanically attached to a deployment system, wherein the flex circuit and the solar cells span one or more sections of the deployment system.

DRAWINGS

Referring now to the drawings in which like reference numbers represent corresponding parts throughout:

FIGS. 2A, 2B, 2C, 2D and 2E are views of a solar array.

FIGS. 7A, 7B, 7C, 7D and 7E illustrate how the flex circuit could be attached to a deployment system.

FIGS. 8A and 8B illustrate another type of deployment system used with the flex circuit.

DETAILED DESCRIPTION

In the following description, reference is made to the accompanying drawings which form a part hereof, and in which is shown by way of illustration a specific example in which the disclosure may be practiced. It is to be understood that other examples may be utilized and structural changes may be made without departing from the scope of the present disclosure.

This disclosure describes a single sheet foldout solar array comprised of a flex circuit with one or more panels of solar cells built thereon, wherein the flex circuit can be folded between the panels. Wiring between the panels and solar cells is embedded in or deposited on the flex circuit, reducing the amount of labor involved in the design, manufacturing, and testing of the solar array. Moreover, the wiring is able to withstand the storage and deployment of the solar array. This structure provides a number of advantages over the prior art.

Figure 1:
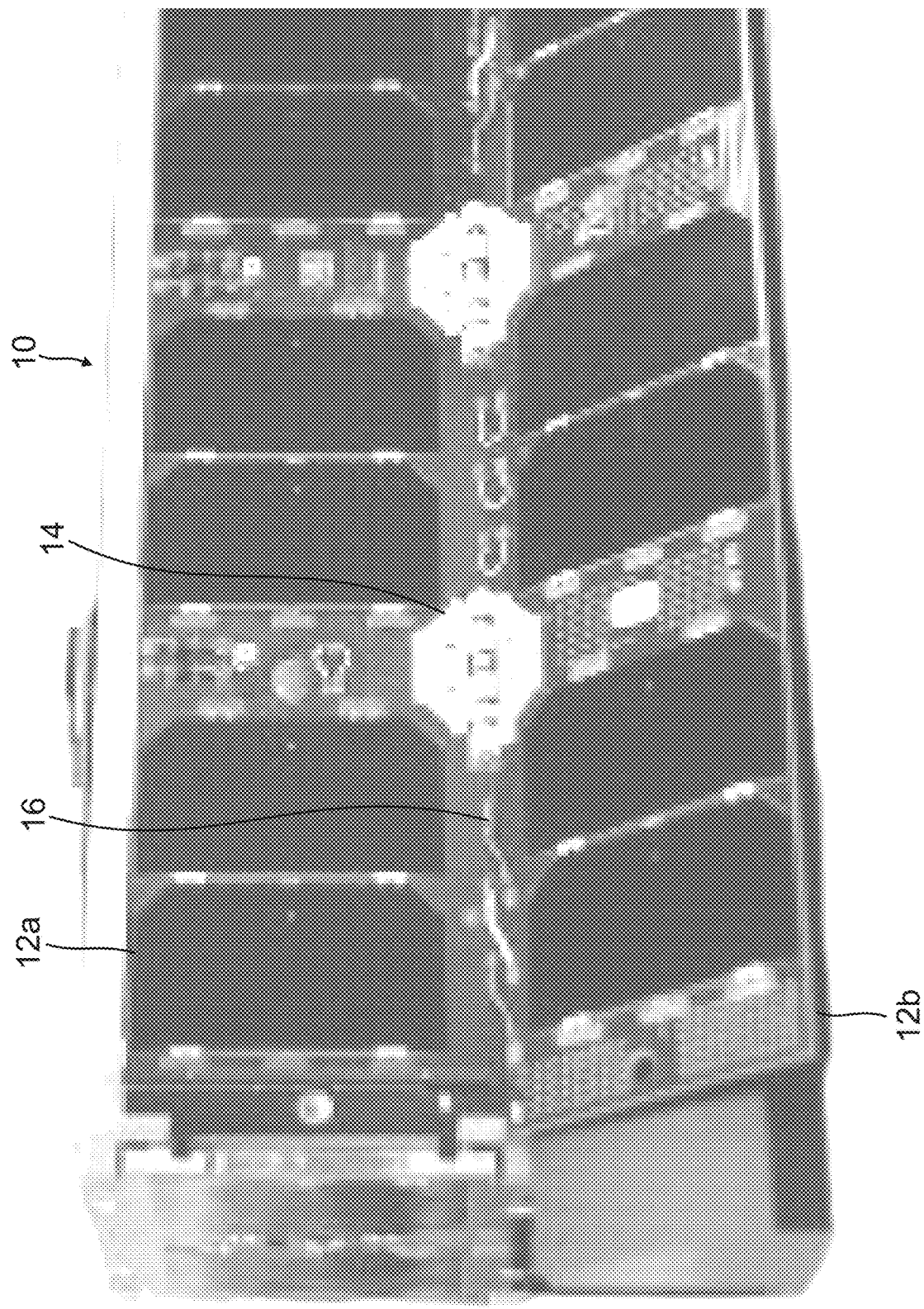
FIG. 1 is an image of a small satellite.

FIG. 1 is an image of a small satellite 10 manufactured by Clyde Space Ltd., wherein the satellite 10 includes two folding solar panels 12a, 12b. The satellite 10 itself is a rectangular box, with one solar panel 12a on the side of the satellite 10 and another solar panel 12b unfolded downward away from the side of the satellite 10. Hinges 14 couple the solar panels 12a, 12b, and allow the solar panel 12b to be unfolded downward from solar panel 12a. Various wires 16 and other components are visible adjacent the hinges 14. However, the hinges 14 limit the number of panels 12a, 12b that can be used, as well as increase the complexity and weight of the panels 12a, 12b, while the wires 16 are subject to repeated bending and stretching that risks damaging the wires 16.

FIGS. 2A, 2B, 2C, 2D and 2E are views of a solar array 18 manufactured by MMA Design LLC, having solar panels 20 and an extendible triangular boom structure 22, wherein FIG. 2A shows the solar array 18, panels 20 and boom structure 22 in a stowed configuration, FIGS. 2B and 2C show the solar array 18, panels 20 and boom structure 22 in a Z-fold configuration when partially deployed, FIG. 2D shows the solar array 18, panels 20 and boom structure 22 in a Z-fold configuration when fully extended and with its lateral wings 24 deployed in a direction orthogonal or perpendicular to the extension of the Z-fold configuration, and FIG. 2E is a side-view representation 26 of the Z-fold configuration. As shown in FIG. 2A, the solar array 18 is folded flat when stowed. As shown in FIGS. 2B and 2C, the boom structure 22 extends and unfolds the solar array 18. As shown in FIG. 2D, while the panels 20 of the solar array 18 are very compact when stowed, the panels 20 occupy a very large area when deployed in order to provide a large amount of solar power. However, the solar array 18 is mechanically complex, and the wiring of the panels 20 is manually intensive.

Figure 3:
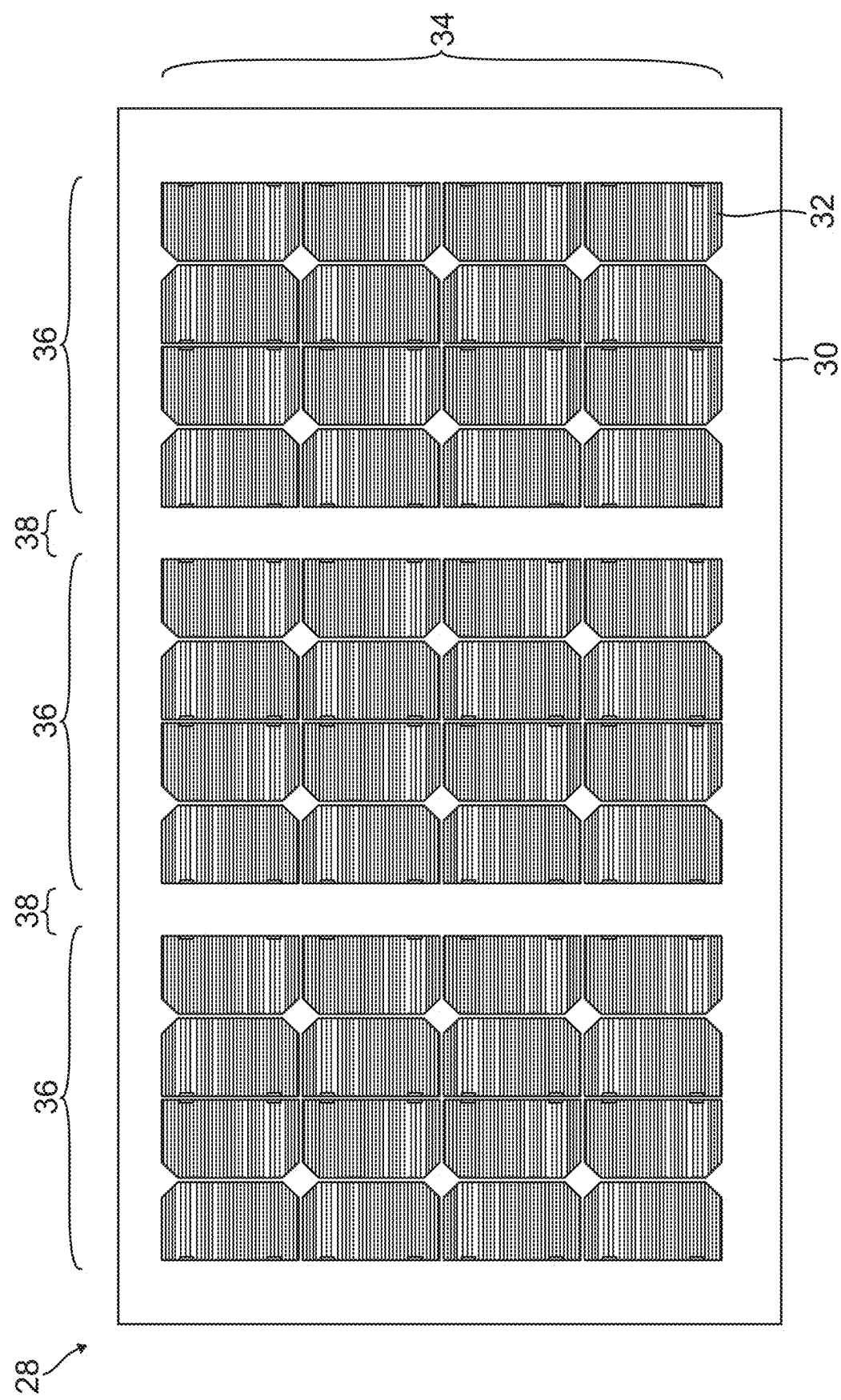
FIG. 3 illustrates a single sheet foldout solar array.

FIG. 3 illustrates a single sheet foldout solar array 28 according to this disclosure. The single sheet foldout solar array 28 is comprised of a flex circuit 30 that is a single sheet with one or more solar cells 32 mechanically attached thereto, wherein the solar cells 32 are arranged in one or more panels 34 and each of the panels 34 comprise a two-dimensional (2D) array of the solar cells 32. In this example, three panels 34 are shown, wherein each of the panels 34 comprises a 4×4 array of solar cells 32 arranged in 4 rows and 4 columns.

The flex circuit 30 includes one or more flat sections 36 where the panels 34 of solar cells 32 are mounted and one or more folding sections 38 separating the flat sections 36 where the flex circuit 30 can be folded. The flex circuit 30 has the advantage that it can be folded at the folding sections 38 between the flat sections 36, while the flat sections 36 remain substantially flat. The folding sections 38 allow the solar array 28 to be folded into a more compact shape for storage.

The flex circuit 30 can be so dimensioned as to connect to one or more panels 34 of the solar cells 12. Alternatively, the flex circuit 30 can be so dimensioned as to connect to a portion of one or more panels 34 of the solar cells 12. In addition, there can be a plurality of the flex circuits 30 extending across one of the folding sections 38.

Figure 4:
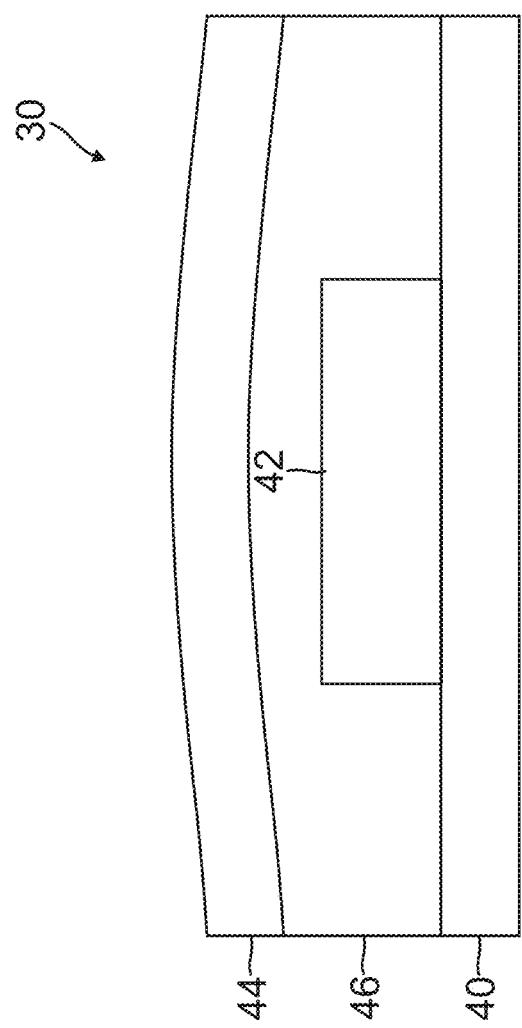
FIG. 4 is a cross-sectional side view of a portion of a flex circuit.

FIG. 4 is a cross-sectional side view of a portion of the flex circuit 30 according to this disclosure. The flex circuit 30 comprises a flexible substrate 40 having at least one conducting layer 42 for making electrical connections to the solar cells 32. The conducting layer 42 can be patterned to provide embedded conductors or wiring for the electrical connections.

In one example, the conducting layer 42 is sandwiched between at least two insulating layers in the flex circuit 30, namely, the flexible substrate 40 and insulating layer 44, which is laminated on top of the conducting layer 42 and flexible substrate 40 using an adhesive 46.

In this example, the flexible substrate 40 is polyimide or another polymer, the conducting layer 42 is copper (Cu) or another metal or alloy, the insulating layer 44 is polyimide or another polymer, and the adhesive 46 is a space-qualified adhesive for polymers.

In other examples, the flex circuit 30 can have more than one conducting layer 42 in a laminate structure, with each of the additional conducting layers 42 sandwiched between two insulating layers, such as the insulating layer 44 and an additional insulating layer 44 or two additional insulating layers 44, such that each of the conducting layers 42 provides embedded conductors or wiring for making electrical connections with the solar cells 32.

Note that the conducting layer 42 can be exposed in order to make the electrical connections with the solar cells 32. Alternatively, vias, interconnects, other conductors, or other structures, can be used to electrically connect the conducting layer 42 with the solar cells 32.

One advantage to the use of the flex circuit 30 is that the conducting layer 42 is embedded therein at the time of manufacture and extends across one or more flat sections 36 and folding sections 38, so that no or minimal additional manufacturing effort is necessary to attach wiring. Preferably, the conducting layer 42 in the flex circuit 30 is patterned such that the resulting conductors are thin (e.g., fractions of a millimeter in thickness), and thus easier to bend, and not damaged by bending.

This structure is more flexible than conventional solar panels and the wiring therebetween. Using this structure, the solar cells 32 can be assembled into strings and attached to the flex circuit 30. Moreover, the corner connection approach to solar array fabrication described in the cross-reference applications above is ideal for this single sheet folded solar array 28 configuration.

Figure 5:
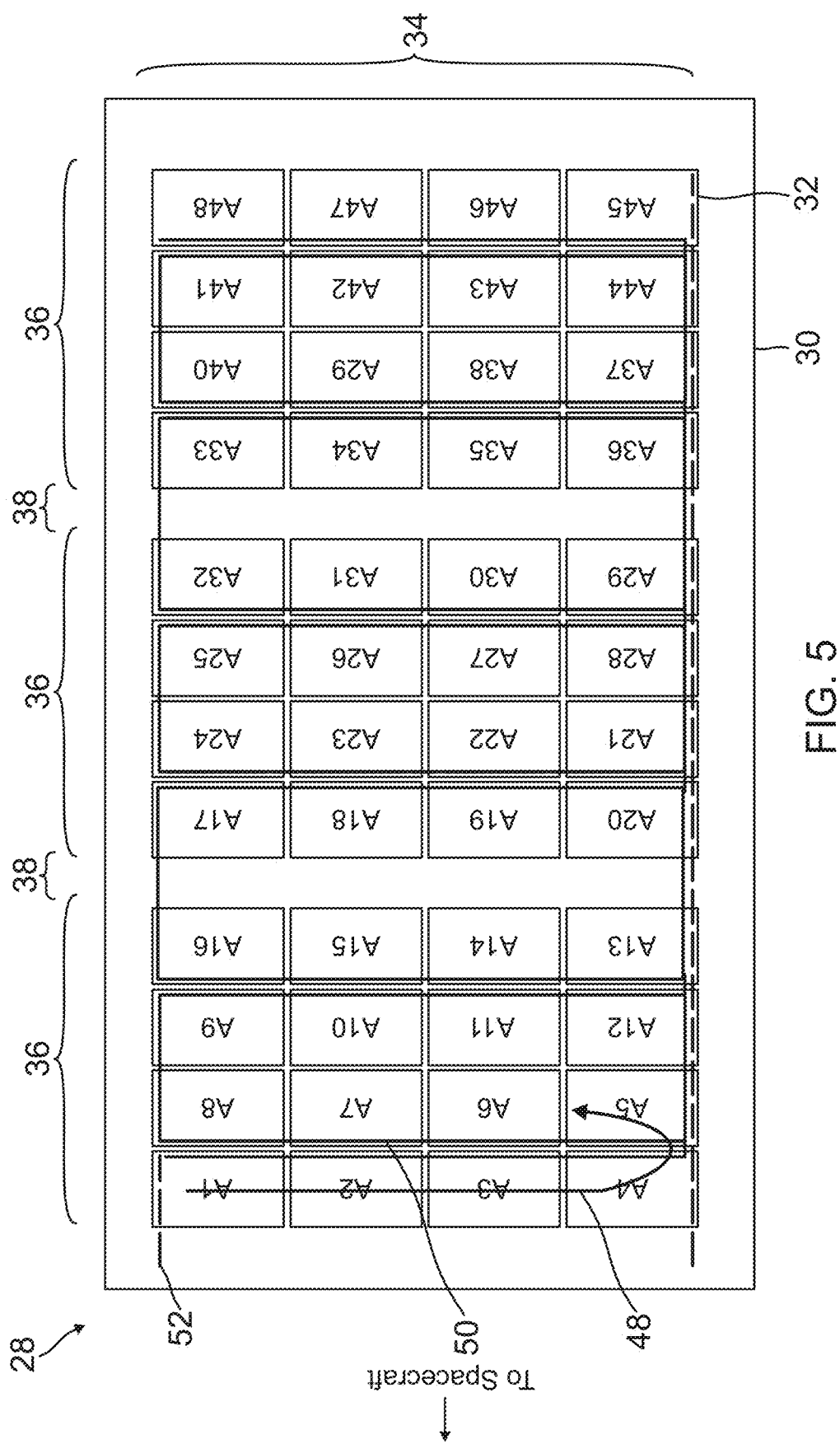
FIG. 5 shows an example where solar cells are attached to the flex circuit and wired in series as a string.

FIG. 5 shows an example where 48 solar cells 32 are attached to the flex circuit 30 and wired in series as a string to produce a 100V output. In this example, there are three panels 34 mounted on three flat sections 36 of the flex circuit 30 and separated by two folding sections 38 of the flex circuit 30, wherein each of the panels 34 contains 16 solar cells 32, with the solar cells 32 labeled A1-A16 in the first panel 34, A17-A32 in the second panel 34, and A33-A48 in the third panel 34. The serpentine line with an arrow 48 shows the flow of current between the series-connected solar cells 32 labeled A1-A5.

Conductors 50, which are embedded in the flex circuit 30, connect between the solar cells 32 within the 48 cell string. Between the solar cells 32 labeled A1, A2, A3, these conductors 50 only reach between adjacent solar cells 32. At the top of the rows in the panels 34, the solar cells 32 are back-to-back (for example, A8 and A9). Here, the conductor 50 extends from the corner region of the solar cell 32 labeled A8 to the corner region of the solar cell 32 labeled A9. This sequence continues to the solar cells 32 labeled A16 and A17. The conductor 50 again connects between the corner regions of the two solar cells 32. Here, there is the wide gap, i.e., the folding section 38, between the solar cells 32 labeled A16 and A17, where the solar array 28 can be folded. Only the thin flexible layers of the flex circuit 30 are present in the folding sections 38.

Although this example describes a corner connection approach, a more conventional solar cell connection approach could be used, with linear strings and end tabs implemented. The fundamental part of this disclosure is that the wiring in the folding sections 38 between the flat sections 36, as well as the flat sections 36 themselves, is embedded in the flex circuit 30.

Conductors 52, which are also embedded in the flex circuit 30, terminate the strings of solar cells 32 and carry the current away from the solar cells 32 and off of the solar array 28 to the spacecraft (not shown).

This example shows a string length of 48 solar cells 32, which is longer than the 16 solar cells in any single panel 34. This example also locates all the string terminations at the top or bottom of a column of solar cells 32.

Figure 6:
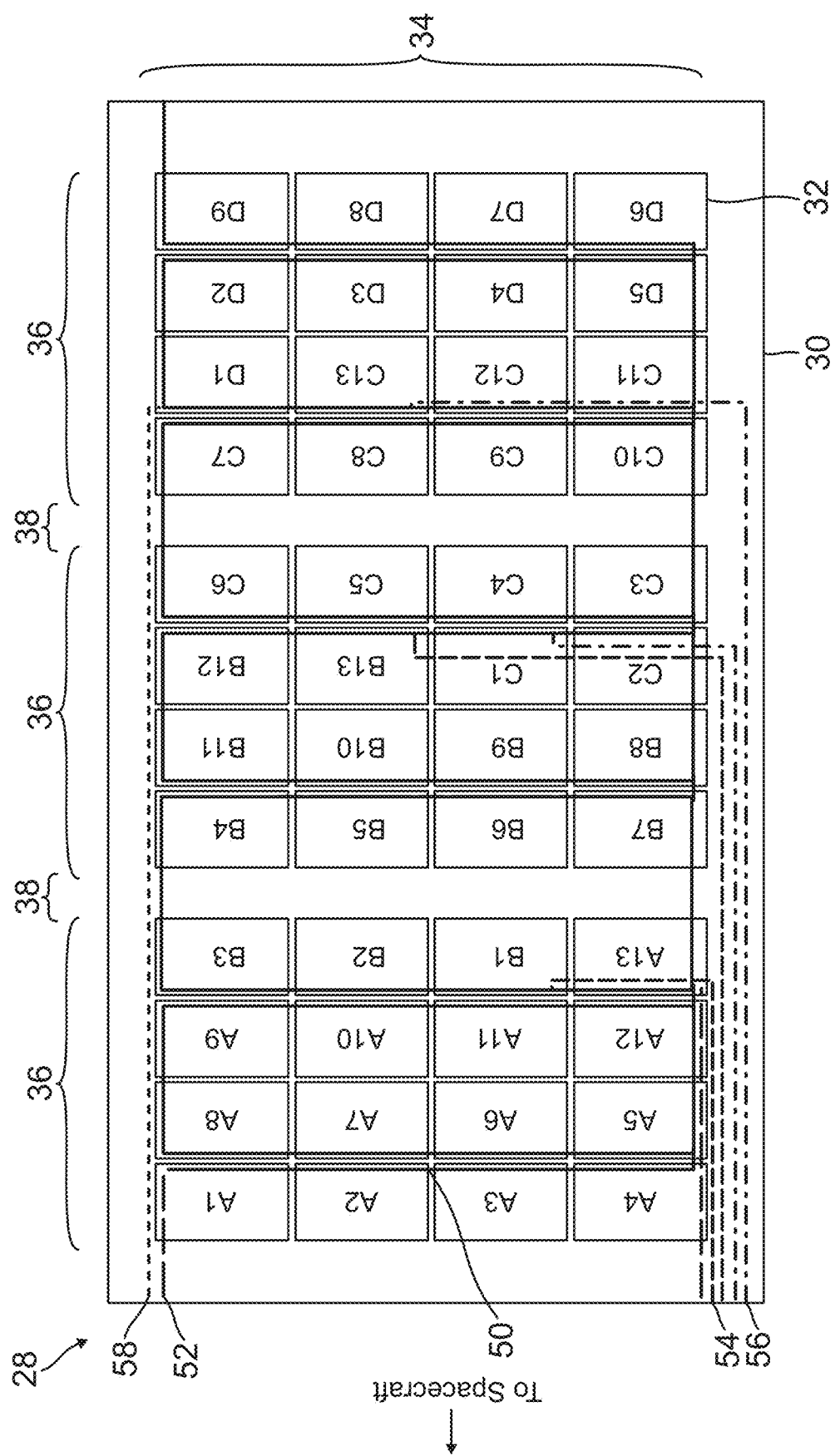
FIG. 6 shows another example where solar cells are attached to the flex circuit and wired in series as a string.

FIG. 6 shows an example with a 13 solar cell string length in a single panel 34, which is smaller than the 16 solar cells in the single panel 34 shown in FIG. 5. The conductors 50, which are embedded in the flex circuit 30, again show the series connections between solar cells 32. A first string with solar cells 32 labeled A1 to A13 is terminated by the conductors 52, which are embedded in the flex circuit 30. Between the corners of each solar cell 32, there are conductors 50, which are bridging lines between the solar cells 32, and which are embedded in the flex circuit 30.

A second string with solar cells 32 labeled B1 to B13 is terminated by conductors 54, which are embedded in the flex circuit 30. One conductor 54 runs underneath the solar cell 32 labeled A13 to connect to the solar cell 32 labeled B1. Another conductor 54 runs underneath the solar cells 32 labeled C2 and C1 to connect to the solar cell 32 labeled B13.

A third string with solar cells 32 labeled C1 to C13 is terminated by conductors 56, which are embedded in the flex circuit 30. One conductor 56 runs underneath the solar cell 32 labeled C2 to connect to the solar cell 32 labeled C1. Another conductor 56 runs underneath the solar cells 32 labeled C11 and C12 to connect to the solar cell 32 labeled C13.

The solar cell 32 labeled D1 is at the top row of a panel 34 and conductor 58 is connected to it along the top edge of the flex circuit 30, either on or in the flex circuit 30. This shows how series-connected solar cells 32 can be easily connected across the folding sections 38 of the flex circuit 30 for use in a Z-fold configuration. In addition, the solar cell 32 labeled D9 would connect to solar cells 32 on other panels 34 or other flex circuits 30, in order to complete the circuit of 13 solar cells 32.

In one example, the conductors 50, 52, 54, 56, 58 shown in FIGS. 5 and 6 are embedded in the same conducting layer 42 of the flex circuit 30 and therefore cannot cross each other. However, an alternative example would embed the conductors 50, 52, 54, 56, 58 in different conducting layers 42 of the flex circuit 30, which would allow the conductors 50, 52, 54, 56, 58 to cross over and under each other. Any number of insulating layers 44 and conducting layers 42 can be present in the flex circuit 30, although this may result in additional expense in its manufacture, additional thickness of the flex circuit 30, as well as additional mass of the flex circuit 30.

Figure 7D:
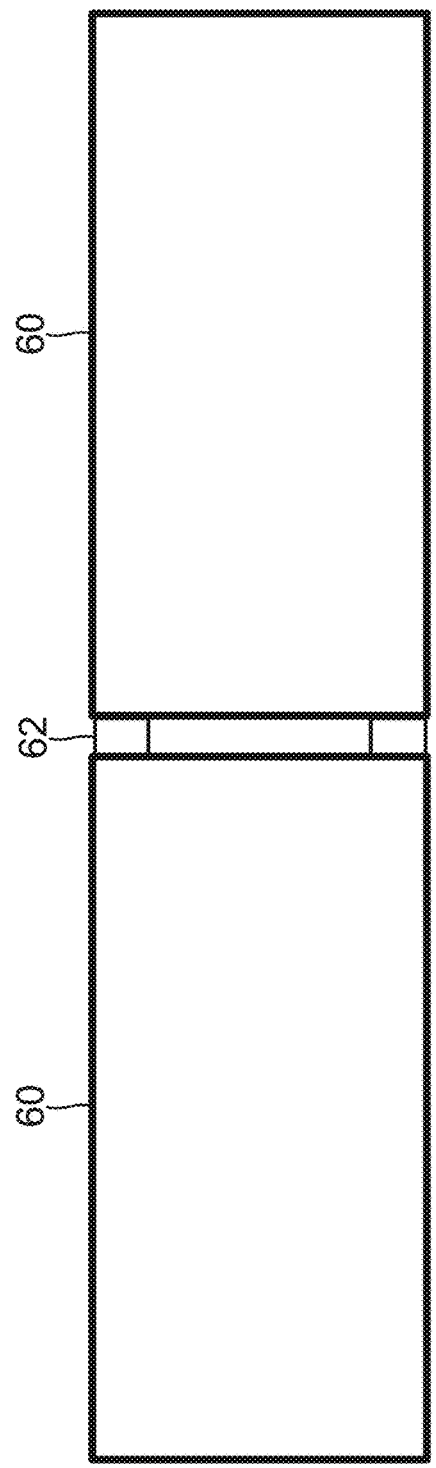

FIGS. 7A, 7B, 7C, 7D and 7E illustrate how the flex circuit 30, and the solar cells 12, could be mechanically attached to a deployment system. In this example, the deployment system involves rigid panels 60 connected via hinges 62, with the flat sections 36 of the flex circuit 30 attached to one side of each of the rigid panels 60, and the folding sections 38 of the flex circuit 30 positioned between the rigid panels 60. Specifically, FIG. 7A is a side view that shows the rigid panels 60 in a stowed configuration, FIG. 7B is a side view that shows the rigid panels 60 in a Z-fold configuration when partially deployed, and FIG. 7C is a side view that shows the rigid panels 60 lying flat when fully deployed and extended. In this deployment system, alternating fronts and backs of the flex circuit 30 are folded together, which results in the Z-fold configuration. Alternatively, the rigid panels 60 could be replaced with a variety of structures to keep the flat sections 36 of the flex circuit 30 at least nominally flat.

Figure 7E:
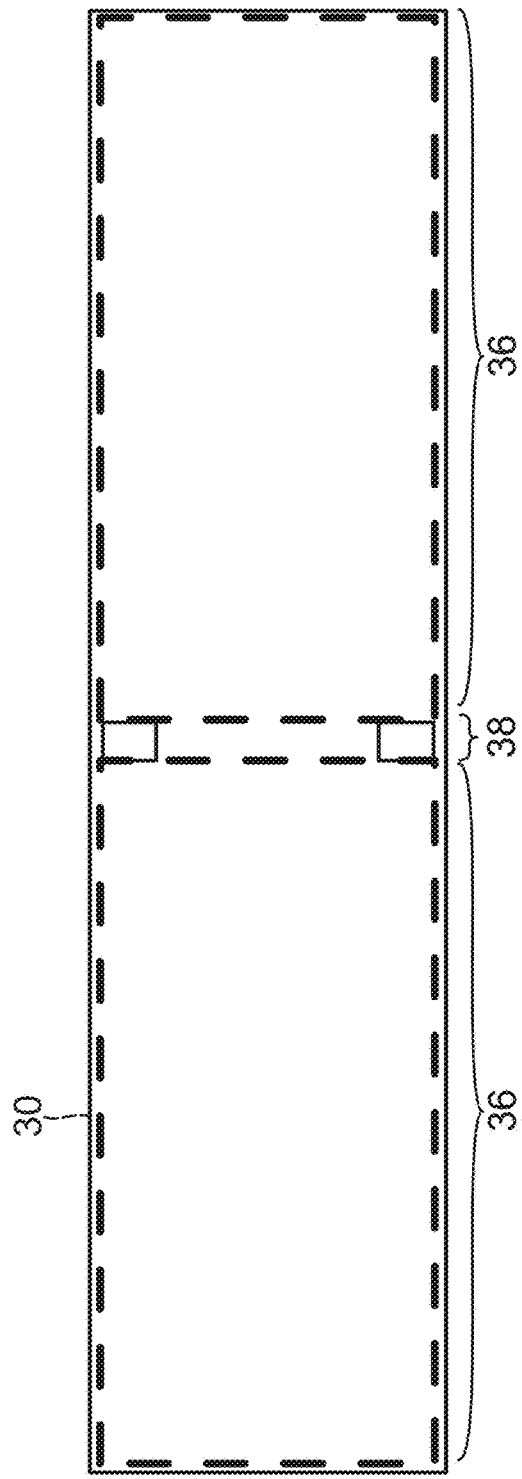

FIGS. 7D and 7E are front views of two of the rigid panels 60 coupled together by the hinges 62, wherein FIG. 7D shows the rigid panels 60 without the flex circuit 30 mounted thereon and FIG. 7E shows the rigid panels 60 with the flex circuit 30 mounted thereon. As shown in FIG. 7D, each of the rigid panels 60 is a frame having a rectangular support structure. As shown in FIG. 7E, each of the rigid panels 60 support the flex circuit 30 around a perimeter of the flex circuit 30. Specifically, the rigid panels 60 are used to support the flex circuit 30, while allowing the folding sections 38 to be folded with the hinges 62, and keeping the flat sections 36 at least nominally flat.

In other examples, there could be other support elements around and within the perimeter of the rigid panels 60, such as struts, strings, mesh structures, or other elements, which provide additional support to the flat sections 36 of the flex circuit 30.

This type of assembly dramatically changes the production flow in manufacturing the solar arrays. Traditionally, rigid panels are populated with solar cells and, when this is complete, the panels are assembled into the solar array. In this example, the assembly including the rigid panels 60 and hinges 62 can be built and tested at the same time the solar cells 32 are being mounted onto the flex circuit 30, and then the flex circuit 30 and solar cells can be mechanically attached to the rigid panels 60 to complete the solar array 28. This has a significant reduction in time to complete manufacturing which is valuable.

However, a support structure other than the flex circuit 30 could be used as well. For example, the solar cells 32 could be mounted on any support structure that can be mechanically attached to the deployment system, such as an aluminum sheet, a mesh, a carbon fiber sheet, or a fiberglass sheet. The flex circuit 30 and/or other support structure could be attached to a single section of the deployment system or could be attached to span multiple sections of the deployment system.

FIGS. 8A and 8B illustrate another type of deployment system where the solar cells (not shown) are always on the same side of the flex circuit 30. In this example, the solar cells are mounted on one side (e.g., an outer facing side) of the flex circuit 30, which is attached to a coupler 64 and then wrapped around a satellite body 66 for stowage, so that flat sections 36 remain flat and folding sections 38 are folded, as shown in FIG. 8A. Deployment would unwrap and extend the flex circuit 30 as a flat sheet, as shown in FIG. 8B. In this example, the flex circuit 30 can include a stiffer backing material, such as fiberglass, to ensure it maintains the proper shape when stowed and deployed.

This disclosure involves a flex circuit 30 that is a single sheet having flat sections 36 with solar cells 32 and folding sections 38 without solar cells 32. The wiring in the flex circuit 30 crosses both the flat sections 36 and folding sections 38, and is highly flexible. FIGS. 7A-7E and 8A-8B show how this basic structure can be applied to common deployment mechanisms.

The deployment systems in FIGS. 7A-7E and 8A-8B also show how the flex circuit 30 can be extended in one dimension. Further deployment can be achieved with side wings. As the flex circuit 30 extends in a first dimension, side wings can also open orthogonal or perpendicular to the first dimension, similar to the approach shown in FIG. 2.

Figure 9:
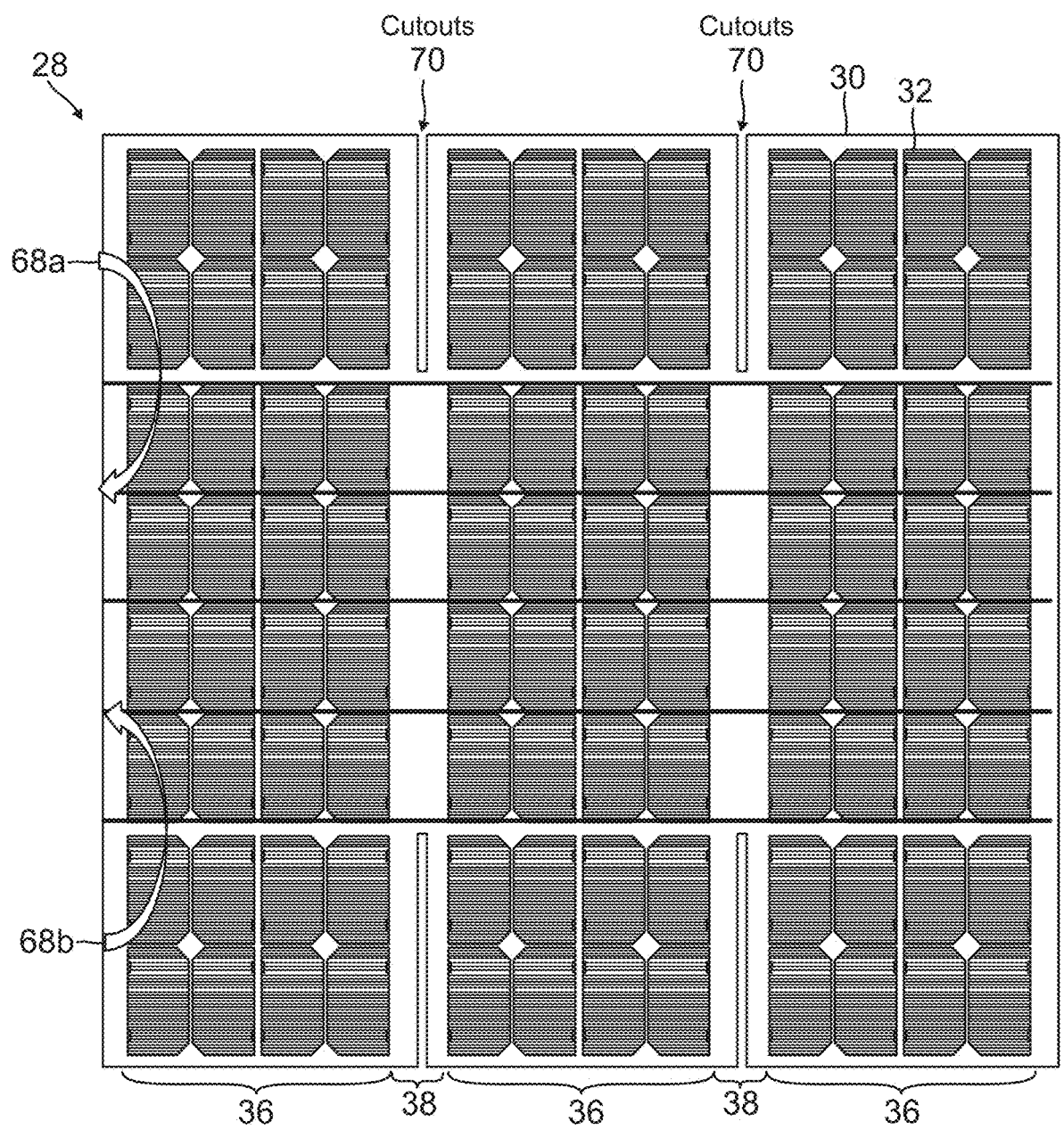
FIG. 9 illustrates a fold-out deployment using the single sheet foldout solar array.

FIG. 9 illustrates a 2D fold-out deployment using the single sheet foldout solar array 28, according to one example. In this example, the single sheet foldout solar array 28 includes wings 68a, 68b that fold (e.g., down and up, respectively) into a center section of the flex circuit 30 in the directions of the arrows, and then the flex circuit 30 is folded in the folding sections 38 to create the Z-fold configuration of the single sheet foldout solar array 28. In this example, the flex circuit 30 has cutouts 70 in the folding sections 38 that define the wings 68a, 68b, thereby allowing each wing 68a, 68b to extend independently. Embedded wiring in the flex circuit 30 can connect the solar cells 32 in the flat sections 36, the folding sections 38, and the wings 68a, 68b.

In this example, the flex circuit 30 has essentially the same dimensions as the panels 34 of solar cells 32 on the flex circuit 30. However, the flex circuits 30 can have dimensions that are only a portion of the panel 34. In addition, a flex circuit 30 can comprise a portion of a first panel 34, extend across a folding section 38, and comprise a portion of a second panel 34. There also can be more than one flex circuit 30 extending across a single folding section 38. This is especially valuable when applying flex circuit wiring to a series of rigid panels.

Figure 10:
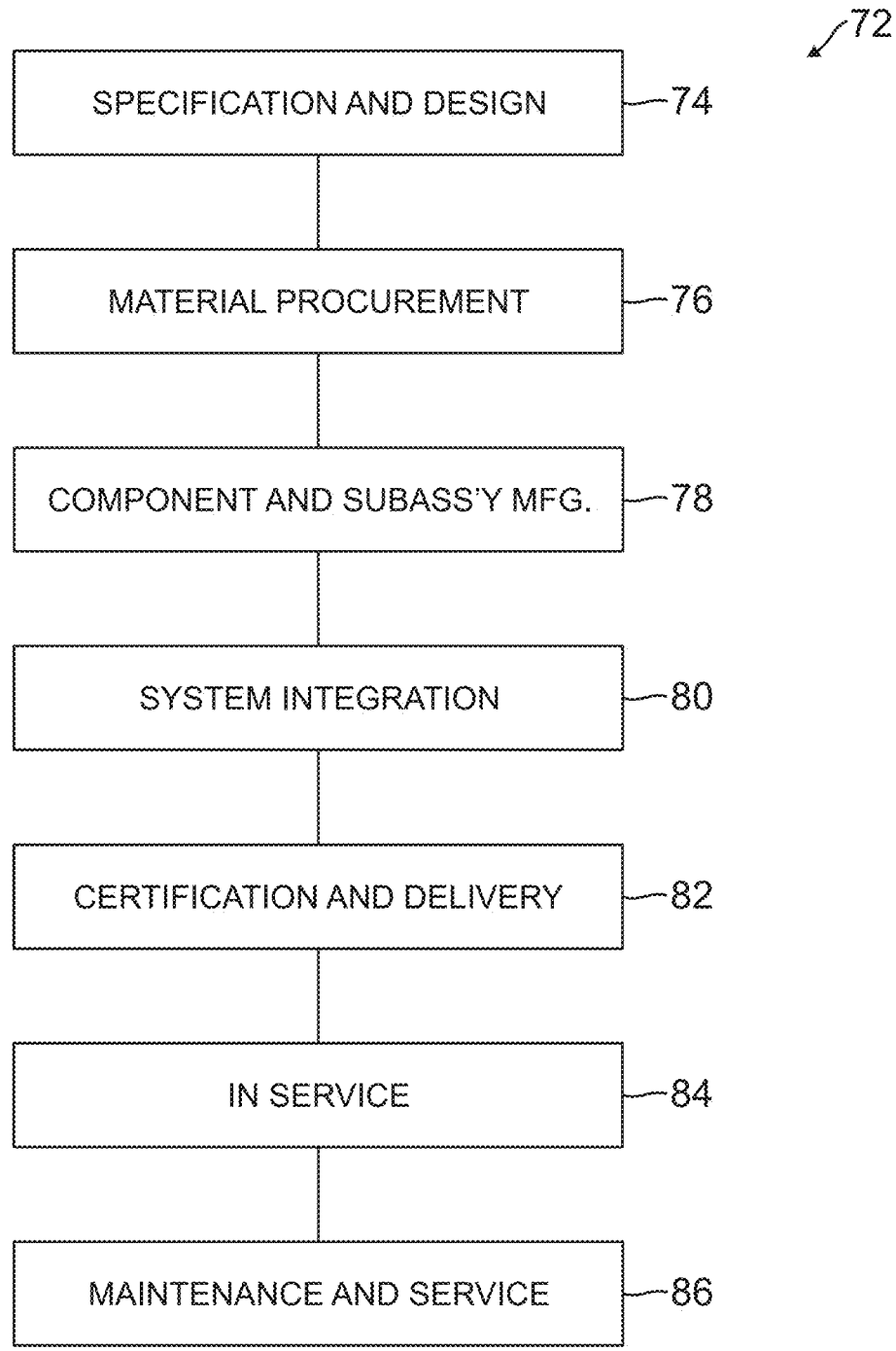
FIG. 10 illustrates a method of fabricating a single sheet foldout solar array for a satellite.
Figure 11:
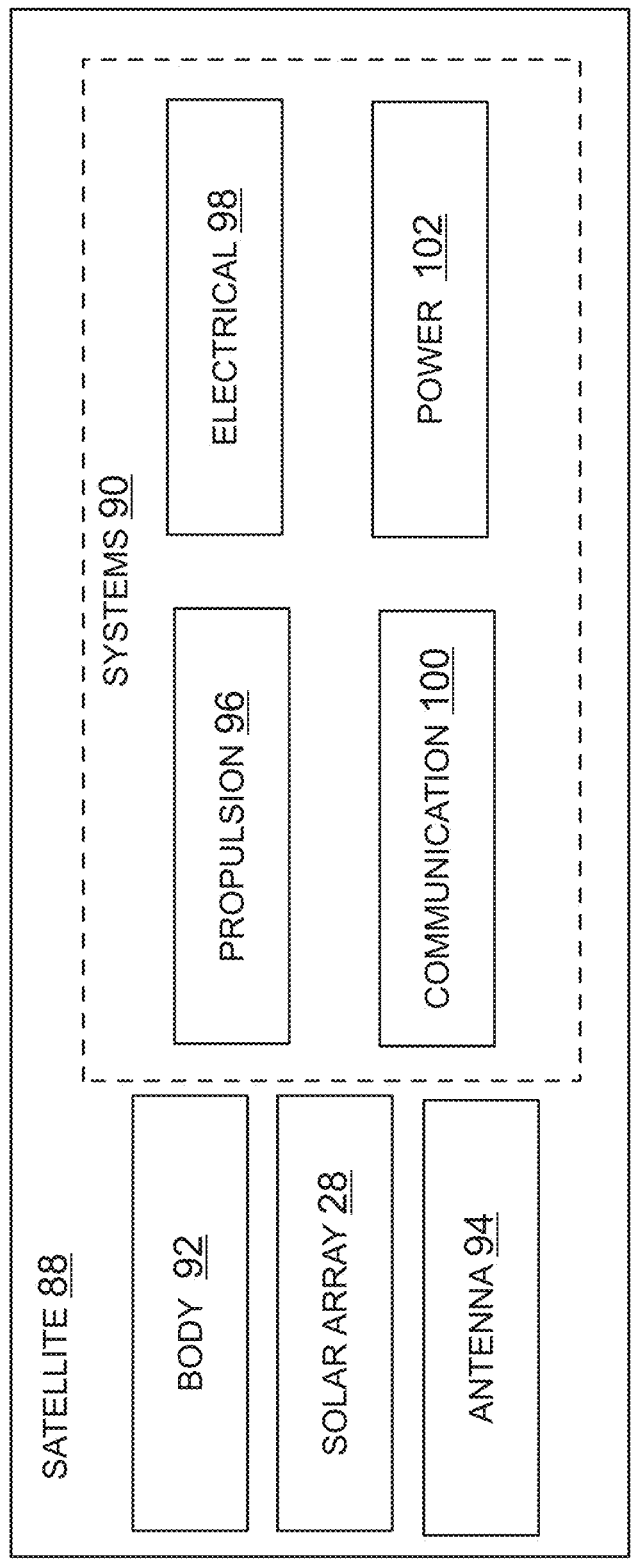
FIG. 11 illustrates the satellite having a single sheet foldout solar array resulting from the method shown in FIG. 10.

Examples of the disclosure may be described in the context of a method 72 of fabricating an apparatus comprising the single sheet foldout solar array 28 for a satellite, the method 72 comprising steps 74-86, as shown in FIG. 10, wherein the resulting satellite 88 having a single sheet foldout solar array 28 is shown in FIG. 11.

As illustrated in FIG. 10, during pre-production, exemplary method 72 may include specification and design 74 of the solar array 28 and/or satellite 88, and material procurement 76 for same. During production, component and subassembly manufacturing 78 and system integration 80 of the solar array 28 and/or satellite 88 takes place, which include fabricating the solar array 28 and/or satellite 88. Thereafter, the solar array 28 and/or satellite 88 may go through certification and delivery 82 in order to be placed in service 84. The solar array 28 and/or satellite 88 may also be scheduled for maintenance and service 86 (which includes modification, reconfiguration, refurbishment, and so on), before being launched.

Each of the processes of method 72 may be performed or carried out by a system integrator, a third party, and/or an operator (e.g., a customer). For the purposes of this description, a system integrator can include without limitation any number of solar cell, solar cell panel, satellite or spacecraft manufacturers and major-system subcontractors; a third party may include without limitation any number of venders, subcontractors, and suppliers; and an operator may be a satellite company, military entity, service organization, and so on.

As shown in FIG. 11, a satellite 88 fabricated by exemplary method 72 can include systems 90, a body 92, one or more single sheet foldout solar arrays 28, and one or more antennae 94. Examples of the systems 90 included with the satellite 88 include, but are not limited to, one or more of a propulsion system 96, an electrical system 98, a communications system 100, and a power system 102. Any number of other systems 90 also may be included.

Figure 12:
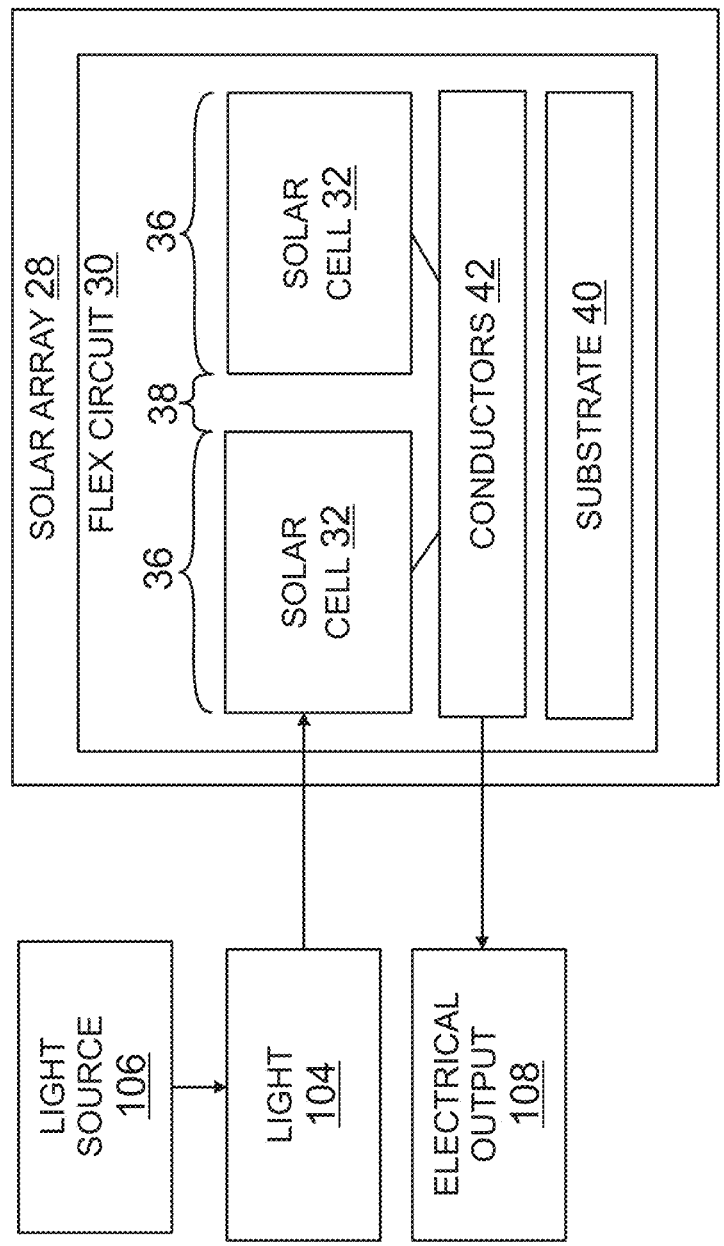
FIG. 12 is an illustration of the single sheet foldout solar array in the form of a functional block diagram.

FIG. 12 is an illustration of a method of deploying and operating the single sheet foldout solar array 28, in the form of a functional block diagram, according to one example. When deployed, the solar array 28 is comprised of one or more of the solar cells 32 individually connected to the flex circuit 30, wherein: the flex circuit 30 is a single sheet; the flex circuit 30 is comprised of the flexible substrate 40 having one or more conducting layers 42 for making electrical connections to the solar cells 32; and the flex circuit 30 includes one or more flat sections 36 where the solar cells 32 are attached and one or more folding sections 38 between the flat sections 36 where the flexible substrate 40 is folded, wherein the conducting layers 42 connect the solar cells between the flat sections 36 and across the folding sections 38. Each of the solar cells 32 absorbs light 104 from a light source 106 and generates an electrical output 108 in response thereto.

The description of the examples set forth above has been presented for purposes of illustration and description, and is not intended to be exhaustive or limited to the examples described. Many alternatives, modifications and variations may be used in place of the specific elements described above.

What is claimed is:

1. An apparatus, comprising:
    one or more solar cells connected to a flex circuit, wherein:
    the flex circuit is a single sheet comprised of a flexible substrate having a plurality of conductors in one or more conducting layers for making electrical connections to the solar cells, wherein at least one of the conducting layers is embedded in the flex circuit and sandwiched between at least the flexible substrate and an insulating layer laminated on top of the at least one of the conducting layers and the flexible substrate;
    the solar cells are mounted on the flex circuit;
    the flex circuit includes one or more flat sections where the solar cells are attached to the flex circuit and one or more folding sections between the flat sections where the flex circuit is folded;
    at least a first portion of one or more of the conductors is positioned along one or more edges of the flex circuit, laterally separated from the solar cells on the flex circuit, and extending across one or more of the folding sections of the flex circuit; and
    at least a second portion of the one or more conductors connected to the first portion extends from the first portion positioned along the edges of the flex circuit to one or more of the solar cells in a string, and underneath one or more of the solar cells that are not in the string, for making the electrical connections to the one or more of the solar cells in the string.

2. The apparatus of claim 1, wherein at least one of the conducting layers is deposited on the flex circuit.

3. The apparatus of claim 1, wherein the flat sections include the conducting layers.

4. The apparatus of claim 1, wherein the folding sections include the conducting layers.

5. The apparatus of claim 1, wherein the conducting layers connect to the solar cells in the flat sections.

6. The apparatus of claim 1, wherein the conducting layers connect to the solar cells between the flat sections and across the folding sections.

7. The apparatus of claim 1, wherein the conducting layers carry current off the flex circuit.

8. The apparatus of claim 1, wherein the flat sections remain flat when the flex circuit is folded.

9. The apparatus of claim 1, wherein the flex circuit is folded in a Z-fold configuration.

10. The apparatus of claim 1, wherein the flex circuit includes wings that extend perpendicular to folds in the flex circuit.

11. The apparatus of claim 1, wherein the flex circuit is so dimensioned as to connect to one or more panels of the solar cells.

12. The apparatus of claim 1, wherein the flex circuit is so dimensioned as to connect to a portion of one or more panels of the solar cells.

13. The apparatus of claim 1, wherein there are a plurality of the flex circuits extending across one of the folding sections.

14. The apparatus of claim 1, wherein the solar cells are mechanically attached to the flex circuit.

15. The apparatus of claim 1, wherein the flex circuit and the solar cells are mechanically attached to a deployment system.

16. The apparatus of claim 15, wherein the flex circuit and the solar cells span one or more sections of the deployment system.

17. The apparatus of claim 1, wherein the solar cells are mounted on a support structure that is mechanically attached to a deployment system.

18. The apparatus of claim 17, wherein the support structure comprises one or more sheets of polymer, polyimide, fiberglass, carbon fiber, aluminum or a mesh.

19. The apparatus of claim 17, wherein the support structure and the solar cells span one or more sections of the deployment system.

20. The apparatus of claim 1, wherein at least some of the conductors are in different ones of the conducting layers to allow the at least some of the conductors to cross over and under others of the conductors.

21. A method, comprising:
    connecting one or more solar cells to a flex circuit, wherein:
    the flex circuit is a single sheet comprised of a flexible substrate having a plurality of conductors in one or more conducting layers for making electrical connections to the solar cells, wherein at least one of the conducting layers is embedded in the flex circuit and sandwiched between at least the flexible substrate and an insulating layer laminated on top of the at least one of the conducting layers and the flexible substrate;

the solar cells are mounted on the flex circuit;

the flex circuit includes one or more flat sections where the solar cells are attached to the flex circuit and one or more folding sections between the flat sections where the flex circuit is folded;

at least a first portion of one or more of the conductors is positioned along one or more edges of the flex circuit, laterally separated from the solar cells on the flex circuit, and extending across one or more of the folding sections of the flex circuit and at least a second portion of the one or more conductors connected to the first portion extends from the first portion positioned along the edges of the flex circuit to one or more of the solar cells in a string, and underneath one or more of the solar cells not in the string, for making the electrical connections to the one or more of the solar cells in the string.

22. A method, comprising:

deploying one or more solar cells connected to a flex circuit, wherein:

the flex circuit is a single sheet comprised of a flexible substrate having a plurality of conductors in one or more conducting layers for making electrical connections to the solar cells, wherein at least one of the conducting layers is embedded in the flex circuit and sandwiched between at least the flexible substrate and an insulating layer laminated on top of the at least one of the conducting layers and the flexible substrate;

the solar cells are mounted on the flex circuit;

the flex circuit includes one or more flat sections where the solar cells are attached to the flex circuit and one or more folding sections between the flat sections where the flex circuit is folded; and at least a first portion of one or more of the conductors is positioned along one or more edges of the flex circuit, laterally separated from the solar cells on the flex circuit, and extending across one or more of the folding sections of the flex circuit; and at least a second portion of the one or more conductors connected to the first portion extends from the first portion positioned along the edges of the flex circuit to one or more of the solar cells in a string, and underneath one or more of the solar cells not in the string, for making the electrical connections to the one or more of the solar cells in the string.

\* \* \* \* \*